(12) United States Patent
Burukhin et al.

(10) Patent No.: US 7,663,511 B2
(45) Date of Patent: Feb. 16, 2010

(54) DYNAMIC CHARACTER ENCODING

(75) Inventors: Anatoliy Burukhin, Redmond, WA (US); Eric Borzello, Redmond, WA (US); Athapan Arayasantiparb, Redmond, WA (US); Amit Kumar Ghosh, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 12/141,288

(22) Filed: Jun. 18, 2008

(65) Prior Publication Data

US 2009/0315744 A1 Dec. 24, 2009

(51) Int. Cl.
*H03M 7/00* (2006.01)
(52) U.S. Cl. .............................. 341/50; 341/51; 704/4; 704/10
(58) Field of Classification Search ............ 341/50, 341/51, 87; 704/4, 10
See application file for complete search history.

(56) References Cited

U.S. PATENT DOCUMENTS

| 5,936,636 | A | 8/1999 | Gelfenbain |
| 6,138,086 | A | 10/2000 | Rose et al. |
| 6,204,782 | B1 | 3/2001 | Gonzalez et al. |
| 6,480,867 | B1 | 11/2002 | Kwan |
| 7,199,729 | B2 | 4/2007 | Chen et al. |
| 2004/0006455 | A1* | 1/2004 | Fux et al. ................. 704/4 |
| 2004/0172601 | A1 | 9/2004 | Rettiget et al. |
| 2006/0218133 | A1 | 9/2006 | Atkin et al. |
| 2007/0159366 | A1 | 7/2007 | Lin |
| 2008/0072142 | A1 | 3/2008 | Yao |

OTHER PUBLICATIONS

McEnery, et al., "Developing Linguistic Corpora: a Guide to Good Practice Character Encoding in Corpus Construction", 2004, Anthony McEnery and Richard Xiao, pp. 7.
"Unicode Character Encoding", retrieved at <<http://publib.boulder.ibm.com/infocenter/db2luw/v9/index.jsp?topic=/com.ibm.db2.udb.admin.doc/doc/c0004816.htm>>, pp. 2.
"Camomile", SourceForge, Inc., 1999-2008, pp. 2.

* cited by examiner

*Primary Examiner*—Jean B Jeanglaude
(74) *Attorney, Agent, or Firm*—Capitol City Tech Law; Richard C Irving

(57) ABSTRACT

In one embodiment, a computing device may compress a text file for storage by dynamically creating an encoding table. A storage device of the computing device may store an encoding table populated by string characters from a text file. A processor of the computing device may encode the text file by replacing a string character in a text string of the text file with a table index position of that string character in the encoding table. The processor of the computing device may decode the text file by replacing the table index position with the string character at the table index position in the encoding table.

20 Claims, 7 Drawing Sheets

100

_US 7,663,511 B2_

DYNAMIC CHARACTER ENCODING

BACKGROUND

While a processor may access resources, such as a text file, on a hard drive, this accessing process may take time and reduce the performance efficiency for an application. The processor may access a compressed resource file more quickly than an uncompressed resource file, when stored on a hard drive. However, any gains in the efficient reading of a compressed resource file may be eliminated in the decompression of that compressed resource file.

The language characters in a text file may be represented by any number of binary encoding systems. A software application may use the Unicode industry standard to represent and manipulate text in multiple written languages. A character in a text string may be represented in Unicode by two bytes. Independent of the Unicode standard, a single byte may usually be used to represent all the characters in two written languages. Most existing single byte encoding standards may be unreliable and relatively slow in decoding, as these single byte encoding standards were designed for a particular language and not multiple languages. Eight-bit Unicode Transformation Format (UTF-8) and other mixed single/multi byte encodings may reduce the size of just a small group of languages.

One type of single language encoding standard that a software application may use is the American Standard Code for Information Interchange (ASCII). ASCII may be used to encode text containing English language characters.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

Embodiments discussed below relate to a computing device compressing a text file for storage by dynamically creating an encoding table. A storage device of the computing device may store an encoding table generated from a text file and populated by string characters from the text file. A processor of the computing device may encode the text file by replacing a string character in a text string of the text file with a table index position of that string character in the encoding table. The processor of the computing device may decode the text file by replacing the table index position with the string character at the table index position in the encoding table.

DRAWINGS

In order to describe the manner in which the above-recited and other advantages and features can be obtained, a more particular description is described below and will be rendered by reference to specific embodiments thereof which are illustrated in the appended drawings. Understanding that these drawings depict only typical embodiments and are not therefore to be considered to be limiting of its scope, implementations will be described and explained with additional specificity and detail through the use of the accompanying drawings.

DETAILED DESCRIPTION

Embodiments are discussed in detail below. While specific implementations are discussed, it should be understood that this is done for illustration purposes only. A person skilled in the relevant art will recognize that other components and configurations may be used without parting from the spirit and scope of the subject matter of this disclosure.

A computing device may compress a text file using a dynamically created encoding table. A storage device of the computing device may store an encoding table generated from a text file and populated by string characters from the text file. A processor of the computing device may encode the text file by replacing a string character in a text string of the text file with a first table index position of that string character in the encoding table or by replacing a character set in the text string with a second table index position of that character set in the encoding table. The processor of the computing device may decode the text file by replacing the table index position with the string character or character set at the table index position in the encoding table.

Figure 1:
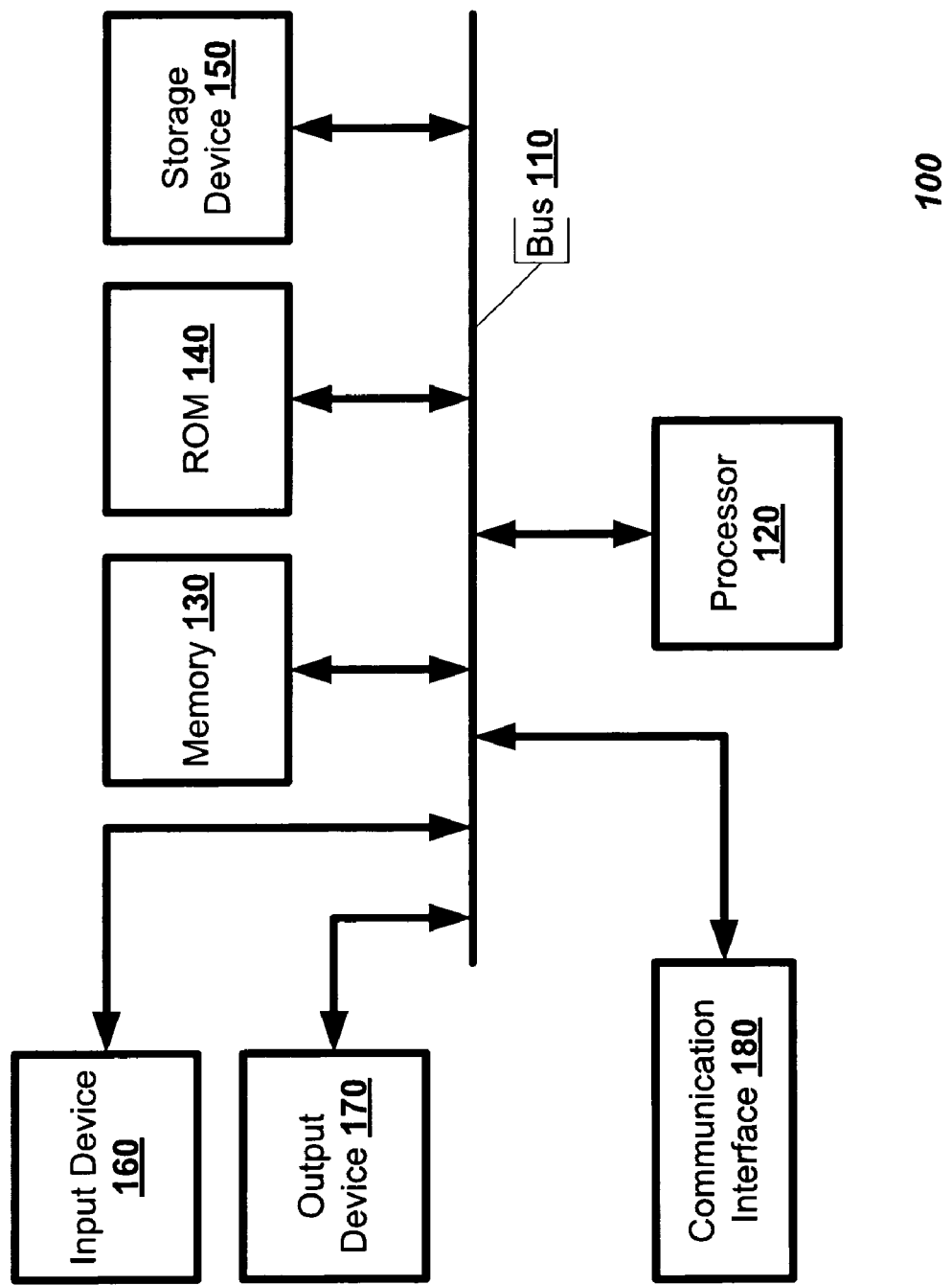
FIG. 1 illustrates a block diagram of an exemplary computing device that may use a dynamically generated encoding table to compress a text file.

FIG. 1 illustrates a block diagram of an exemplary computing device 100 that may use a dynamically generated encoding table in the compression and decompression of a text file, such as a localization resource file. Computing device 100 may be a personal computer, laptop, or other computing device capable of processing text files. Computing device 100 may include a bus 110, a processor 120, a memory 130, a read only memory (ROM) 140, a storage device 150, an input device 160, an output device 170, and a communication interface 180. Bus 110 may permit communication among the components of telecommunication device 100.

Processor 120 may include at least one conventional processor or microprocessor that interprets and executes instructions. Memory 130 may be a random access memory (RAM) or another type of dynamic storage device that stores information and instructions for execution by processor 120. Memory 130 may also store temporary variables or other intermediate information used during execution of instructions by processor 120. ROM 140 may include a conventional ROM device or another type of static storage device that stores static information and instructions for processor 120. Storage device 150 may include any type of media, such as, for example, magnetic or optical recording media and its corresponding drive.

Input device 160 may include one or more conventional mechanisms that permit a user to input information to computing device 100, such as a keyboard, etc. Output device 170 may include one or more conventional mechanisms that output information to the user, including a display, a printer, a medium, such as a memory, or a magnetic or optical disk and a corresponding disk drive, or other type of medium. Communication interface 180 may include any transceiver-like mechanism that enables processing device 100 to communicate with other devices or networks. The interface may be a wireless, wired or optical interface.

Computing device 100 may perform such functions in response to processor 120 executing sequences of instructions contained in a computer-readable medium, such as, for example, memory 130, a magnetic disk, or an optical disk. Such instructions may be read into memory 130 from another computer-readable medium, such as storage device 150, or from a separate device via communication interface 180.

Figure 2:
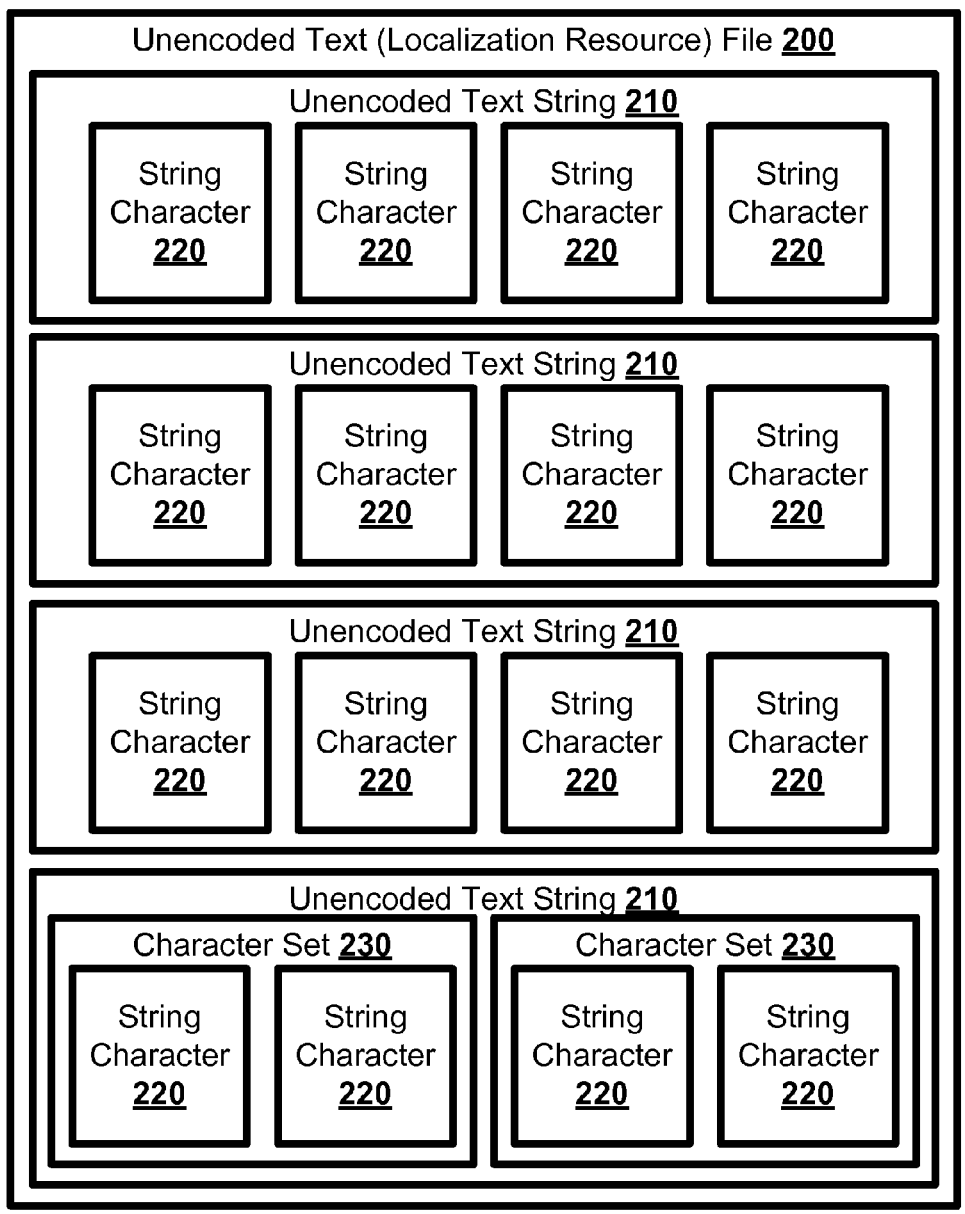
FIG. 2 illustrates, in a block diagram, one embodiment of an unencoded text file.

Processor 120 may seek to access a localization resource file or other text file stored in storage device 150. FIG. 2 illustrates, in a block diagram, one embodiment of an unencoded text file 200. Unencoded text file 200 may be divided into a set of unencoded text strings 210. Each unencoded text string 210 may have a series of string characters 220 representing a written language, grammatical construct, mathematical construct, or code. The string characters 220 may be grouped into character sets 230, representing words, syllables, terms, commands, or equations.

Figure 3:
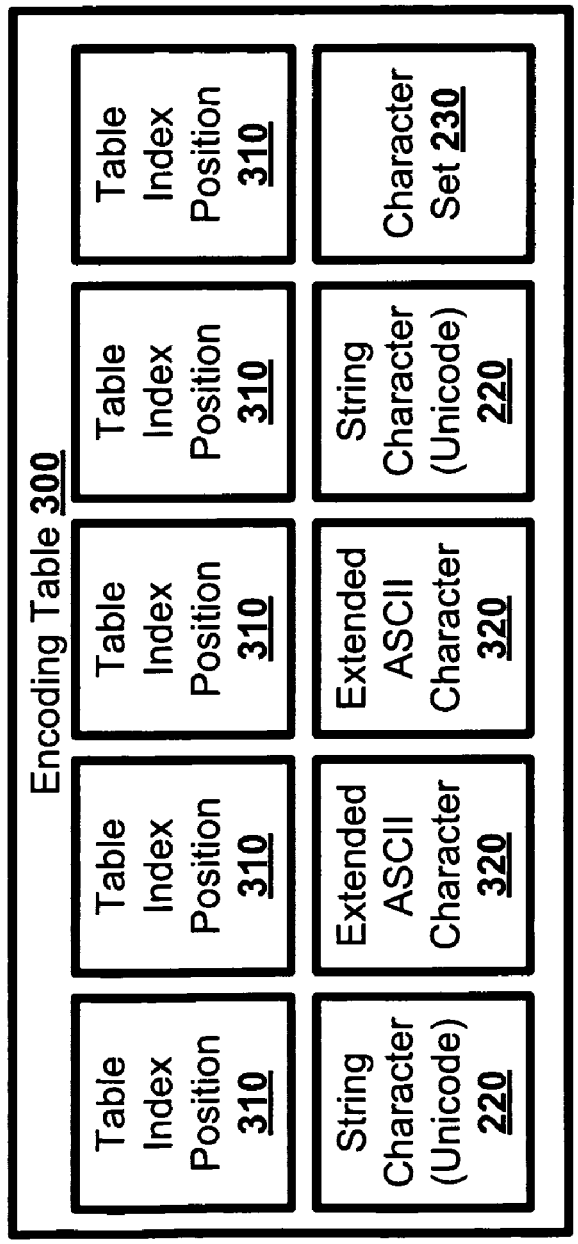
FIG. 3 illustrates, in a block diagram, one embodiment of an encoding table.

Unencoded text file 200 may be used to generate an encoding table. FIG. 3 illustrates, in a block diagram, one embodiment of an encoding table 300. Processor 120 may populate encoding table 300 with each string character 220 in unencoded text file 200. If unencoded text file 200 has more characters than positions available in encoding table 300, processor 120 may leave characters with the fewest appearances as an unmapped character. Encoding table 300 may associate each string character 220 with a table index position 310 marking the position of the character in encoding table 300. String character 220 may be a Unicode character. Encoding table 300 may associate some character sets 230 with table index position 310. Such character sets 230 may be selected for encoding based on frequency of occurrence in unencoded text file 200.

Processor 120 may sort string characters 220 in order of appearance in unencoded text file 200, by number of appearances in unencoded text file 200, or other schema based upon the unencoded text file 200. If string character 220 is an extended American Standard Code for Information Interchange (ASCII) character 320, processor 120 may reorder string characters 220 to align extended ASCII characters 320 with an extended ASCII position.

Figure 4:
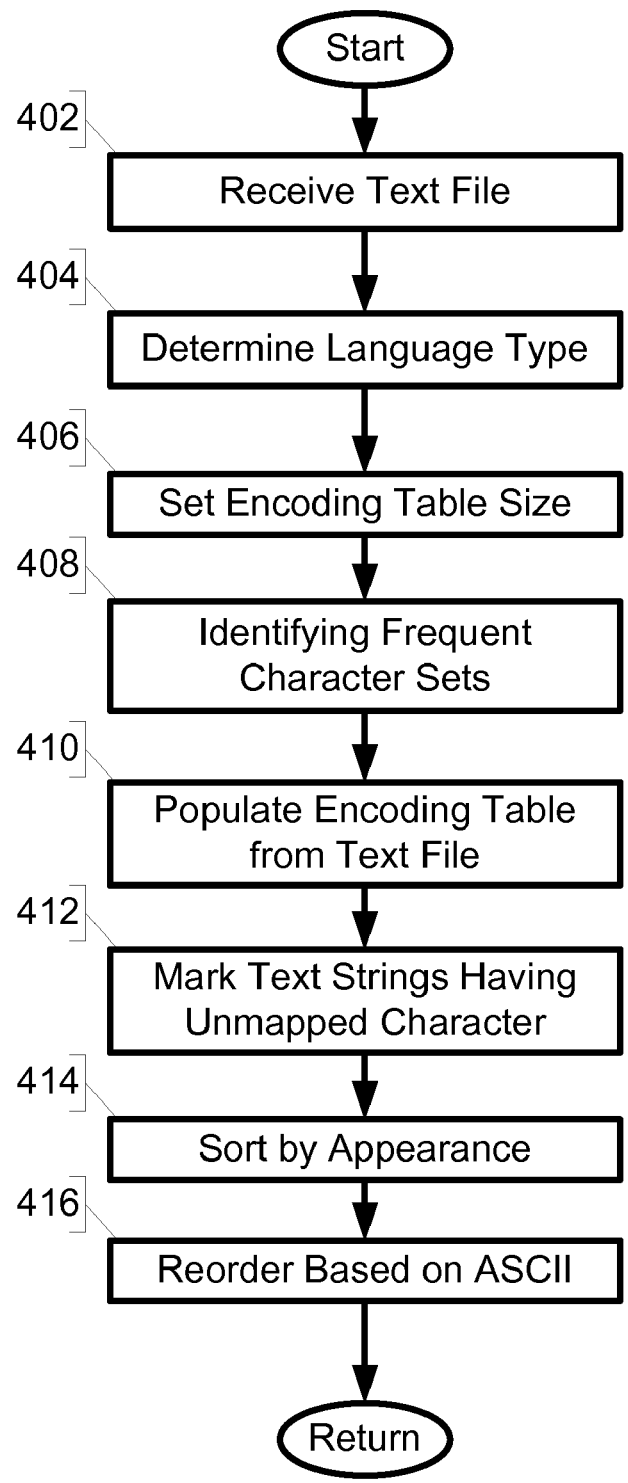
FIG. 4 illustrates, in a flowchart, one embodiment of a method for creating an encoding table.

FIG. 4 illustrates, in a flowchart, one embodiment of a method 400 for creating an encoding table 300. Processor 120 may receive an unencoded text file 200 from a storage device 150, a ROM 140, an input device 160, a communication interface 180, or other data source (Block 402). Processor 120 may determine a language type of unencoded text file 200 (Block 404). Processor 120 may determine a general region for the language type, to determine the number of characters included in that language. For example, an East Asian language, such as Japanese, may require more than 255 characters, or more than can be represented by a single byte. Processor 120 may set the encoding table size based upon the language type or other considerations (Block 406). Processor 120 may identify character sets that appear frequently in unencoded text file 200 (Block 408). Processor 120 may populate encoding table 300 by saving each string character 220 or frequent character set 230 from unencoded text file 200 to encoding table 300 as the string character 220 or frequent character set 230 appears in the unencoded text file (Block 410). Once processor 120 has filled every available space in encoding table 300, processor 120 may scan the remaining text strings 210 in unencoded text file 200 for unmapped characters and mark the text strings 210 where such characters are present (Block 412). Processor 120 may sort the string characters 220 based on order of appearance in unencoded text file 200, by number of appearances in unencoded text file 200, or other schema based upon the unencoded text file 200 (Block 414). If a character may be encoded using extended ASCII encoding, processor 120 may reorder any such extended ASCII characters 320 into a table index position 310 equivalent to extended ASCII encoding (Block 416).

As an example of creating an encoding table 300, a processor may seek to compress an unencoded text file 200 containing fragments of the Lewis Carroll poem, "Jabberwocky." The size of the encoding table in this example may be limited to 16 characters, or four bits. The first unencoded text string 210 may contain the following string of characters: "Twas brillig when the slithey". The second unencoded text string 210 may contain the following string of characters: "toves Did gyre and gimble".

This unencoded text file may result in the following encoding table, with the table index position 310 shown in both decimal notation and hexadecimal notation:

TABLE 1

| 0 | 0 | ' |
|---|---|---|
| 1 | 1 | T |
| 2 | 2 | w |
| 3 | 3 | a |
| 4 | 4 | s |
| 5 | 5 | <space> |
| 6 | 6 | b |
| 7 | 7 | r |
| 8 | 8 | i |
| 9 | 9 | l |
| 10 | a | g |
| 11 | b | h |
| 12 | c | e |
| 13 | d | n |
| 14 | e | t |
| 15 | f | y |

As characters in the second text string are not mapped to the encoding table 300, the second text string may be marked unencoded, or having unmapped characters. Encoding table 300 may be rearranged so that characters are sorted by number of appearances in the unencoded text file, as follows:

TABLE 2

| 0 | 0 | <space> |
|---|---|---|
| 1 | 1 | e |
| 2 | 2 | i |
| 3 | 3 | l |
| 4 | 4 | s |
| 5 | 5 | g |
| 6 | 6 | h |
| 7 | 7 | t |
| 8 | 8 | w |
| 9 | 9 | a |
| 10 | a | b |
| 11 | b | n |
| 12 | c | y |
| 13 | d | ' |
| 14 | e | T |
| 15 | f | r |

The encoding table 300 may be generated by using frequent character sets 230, as well as string characters 220, as follows:

TABLE 3

| | | |
|---|---|---|
| 0 | 0 | <space> |
| 1 | 1 | the |
| 2 | 2 | 'Twas |
| 3 | 3 | bril |
| 4 | 4 | lig |
| 5 | 5 | when |
| 6 | 6 | sli |
| 7 | 7 | y |

Figure 5:
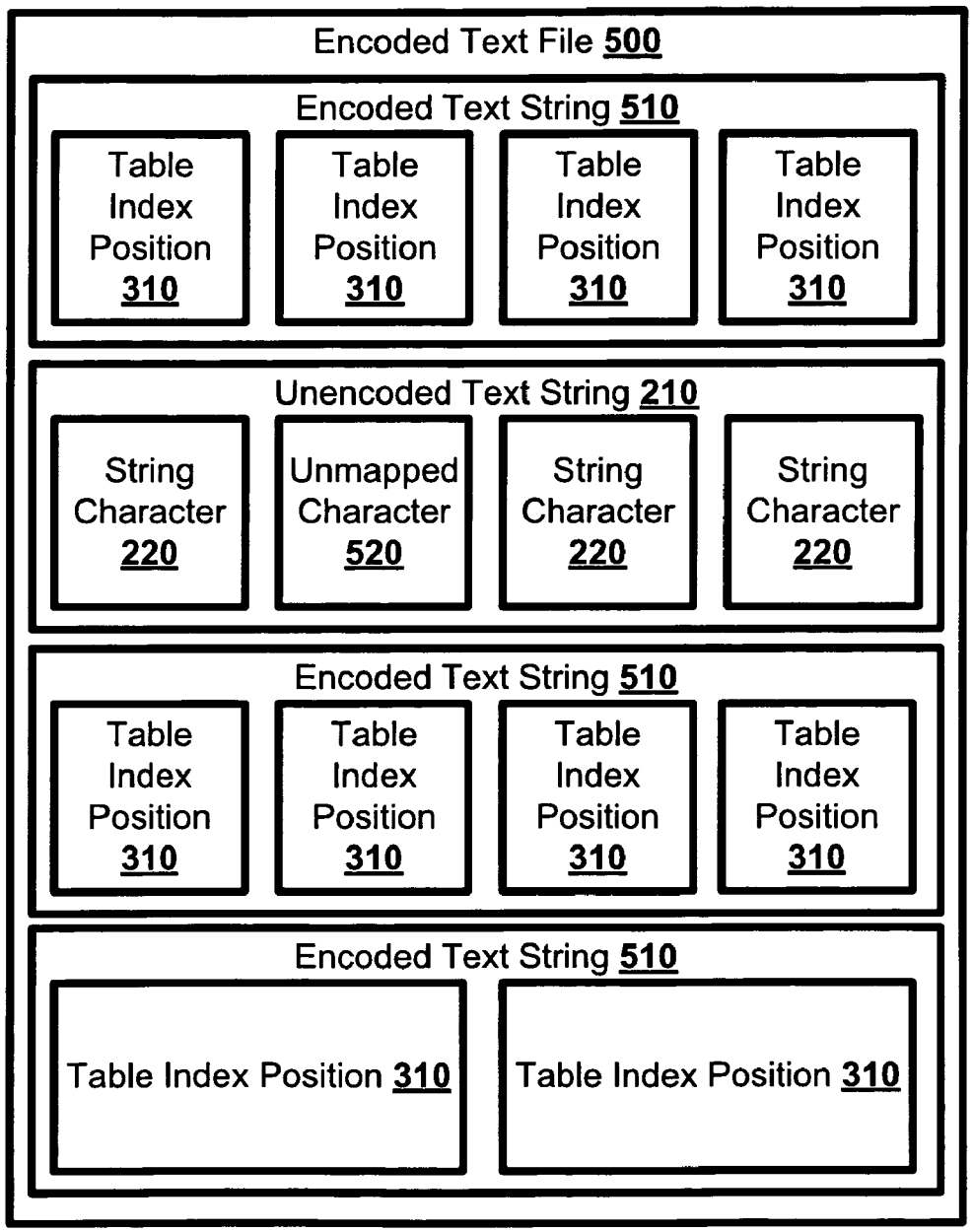
FIG. 5 illustrates, in a block diagram, one embodiment of an encoded text file.

FIG. 5 illustrates in a block diagram one embodiment of an encoded text file 500. Encoded text file 500 may be divided into a set of text strings 510 encoded on a string-by-string basis. Each text string 510 may have a string character 220 or character set 230 in encoded text string 510 replaced by a table index position 310 associated with string character 220 or character set 230 in encoding table 300. If a text string 210 contains an unmapped character 520, then the unencoded text string 210 may be copied directly to the encoded text file 500. An unmapped character 520 may be a string character that is not present in an encoding table. A string character 220 may be unmapped due to lack of space in the encoding table, or other reasons.

Figure 6:
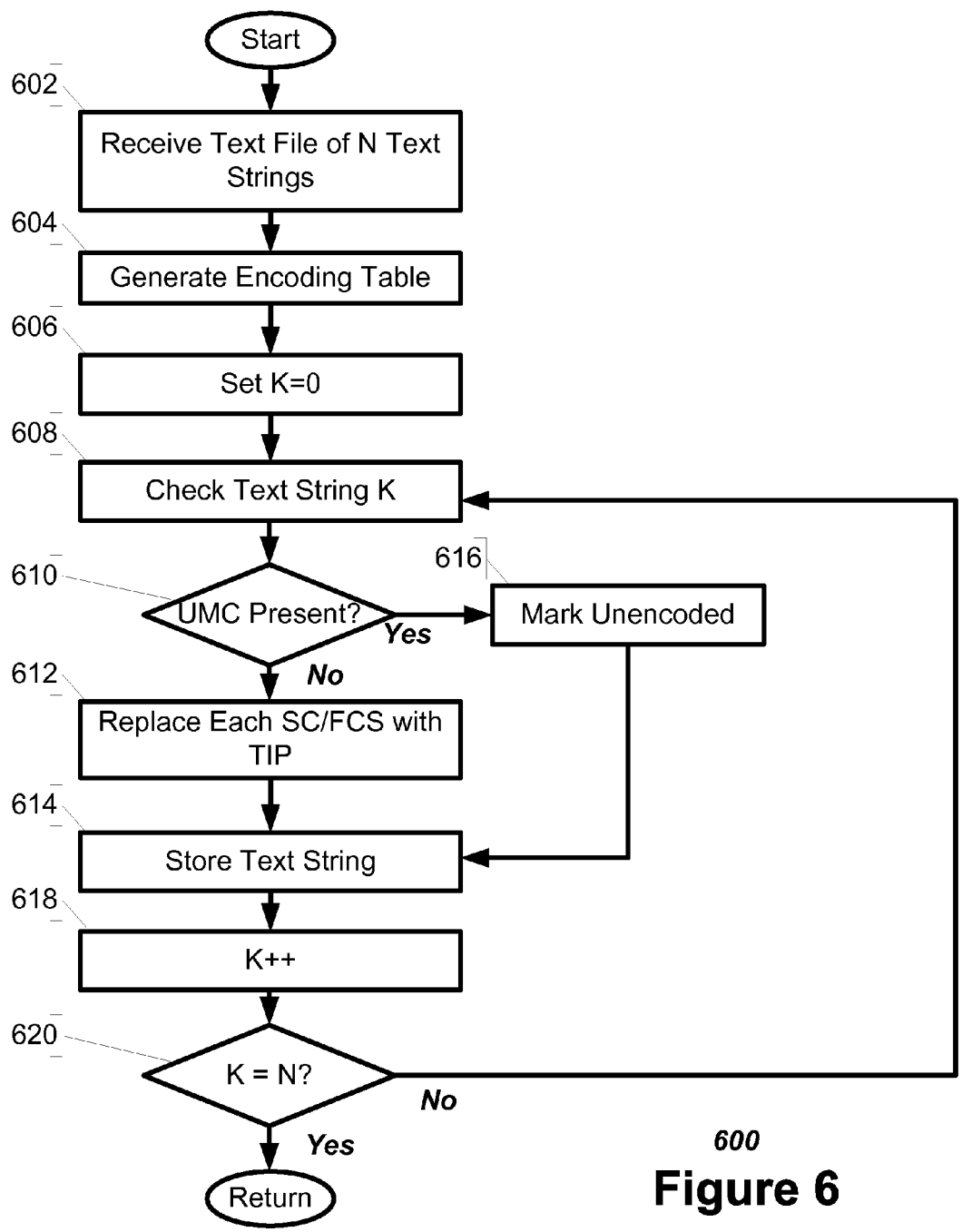
FIG. 6 illustrates, in a flowchart, one embodiment for a method of encoding an unencoded text file using an encoding table.

FIG. 6 illustrates, in a flowchart, one embodiment for a method 600 of encoding for data storage an unencoded text file 200 using encoding table 300. Processor 120 may receive an unencoded text file 200 having one to "N" number of unencoded strings 210 (Block 602). Processor 120 may generate an encoding table 300 based upon unencoded text file 200 (Block 604). Processor 120 may set a text string pointer "K" to zero (Block 606). Processor 120 may check text string "K" for a marker indicating the presence of unmapped characters 520 (Block 608). Text strings may be marked as having an unmapped character 520 during the generation of encoding table 300. If no unmapped character 520 is present (Block 610), then processor 120 may replace each string character (SC) 220 or frequent character set (FCS) in unencoded text string 210 with a table index position (TIP) 310 (Block 612) and store encoded text string 510 as part of the encoded text file 500 in storage device 150 (Block 614). If an unmapped character 520 is present (Block 610), then processor 120 may mark the text string as unencoded (Block 616) and store unencoded text string 210 as part of the encoded text file 500 in storage device 150 (Block 614). Processor 120 may increment the text string pointer "K" (Block 618). If the text string pointer "K" does not equal the number of text strings "N" (Block 620), then the processor 120 may check the next text string (Block 608).

Returning to the "Jabberwocky" example, the unencoded text file 200 may be encoded using the encoding table 300. Using TABLE 2 above, the first text string 210 of the "Jabberwocky" text file (which when unencoded read: "Twas brillig when the slithey") may read when encoded "de8940af233250861b07610432761c". Using TABLE 3 above, the first text string 210 of the "Jabberwocky" text file may read when encoded "203405010617". The second text string 210 (which contained unmapped characters 520 such as "o", "v", "D", and "d" in TABLE 2) may be stored unencoded as "toves Did gyre and gimble".

Figure 7:
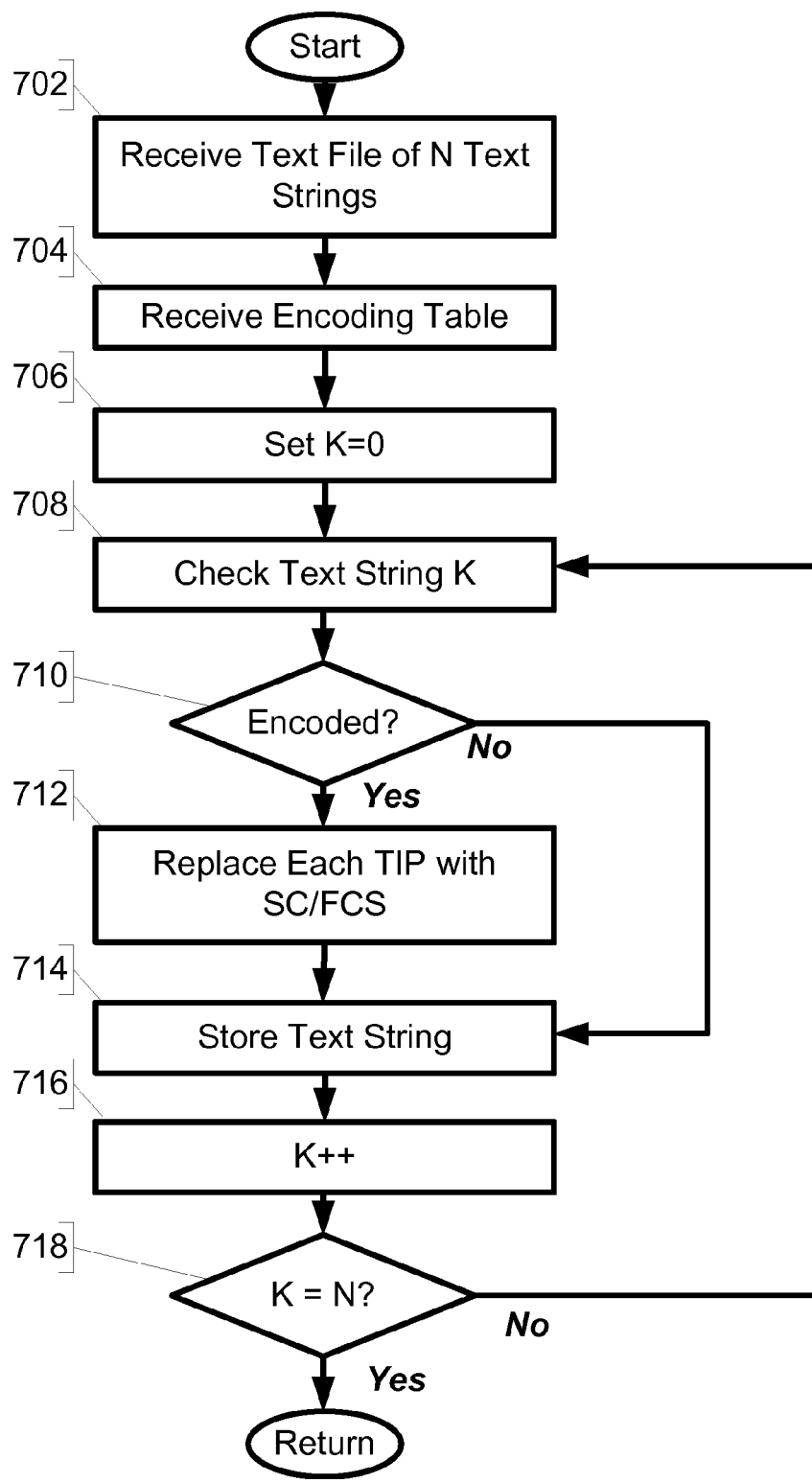
FIG. 7 illustrates, in a flowchart, one embodiment for a method of decoding an encoded text file using an encoding table.

FIG. 7 illustrates, in a flowchart, one embodiment for a method 600 of decoding an encoded text file 500 using encoding table 300. Processor 120 may receive an encoded text file 500 having one to "N" number of unencoded text strings 210 and encoded text strings 510 (Block 702). Processor 120 may receive encoding table 300 from the same source as an encoded text file 500 (Block 704). Processor 120 may set a text string pointer "K" to zero (Block 706). The processor may check text string "K" (Block 708). If no unencoded text string 210 is present (Block 710), then processor 120 may replace each TIP 310 in encoded text string 510 with SC 220 (Block 712) or FCS 230 and store decoded text string 210 as part of the decoded text file 200 in memory 130 (Block 714). If an unencoded text string 210 is present (Block 710), then processor 120 may store unencoded text string 210 as part of the decoded text file 200 in memory 130 (Block 714). Processor 120 may increment the text string pointer "K" (Block 716). If the text string pointer "K" does not equal the total number of text strings "N" (Block 718), then the processor 120 may check the next text string (Block 708).

Although the subject matter has been described in language specific to structural features and/or methodological acts, it is to be understood that the subject matter in the appended claims is not necessarily limited to the specific features or acts described above. Rather, the specific features and acts described above are disclosed as example forms for implementing the claims.

Although the above description may contain specific details, they should not be construed as limiting the claims in any way. Other configurations of the described embodiments are part of the scope of the disclosure. For example, the principles of the disclosure may be applied to each individual user where each user may individually deploy such a system. This enables each user to utilize the benefits of the disclosure even if any one of a large number of possible applications do not use the functionality described herein. Multiple instances of electronic devices each may process the content in various possible ways. Implementations are not necessarily in one system used by all end users. Accordingly, the appended claims and their legal equivalents should only define the invention, rather than any specific examples given.

We claim:

1. A method, implemented on a computing device, for dynamic character encoding, comprising:
   dynamically creating an encoding table based upon a plurality of unencoded text strings of a text file; and
   compressing the text file for data storage by replacing string characters in the plurality of unencoded text strings of the text file with corresponding table index positions of the dynamically created encoding table, wherein
   the computing device performs the method.

2. The method of claim 1, wherein the text file is a localization resource file.

3. The method of claim 1, further comprising:
   compressing the content of the text file by replacing a character set in a first unencoded text string of the text file with a second table index position of the encoding table.

4. The method of claim 1, further comprising:
   sorting content of the encoding table by order of appearance in the text file or by number of appearances in the text file.

5. The method of claim 1, further comprising:
   reordering the encoding table based on an American Standard Code for Information Interchange order.

6. The method of claim 1, further comprising:
   storing a second text string of the text file without encoding if a string character in the second text string is not present in the encoding table.

7. The method of claim 1, further comprising:
   adjusting an encoding table size based upon a language of the text file.

8. A computing device for dynamic character encoding, comprising:

a storage device to store an encoding table; and a processor to dynamically generate the encoding table from a text file and compress the text file by replacing string characters in a plurality of text strings of the text file with corresponding table index positions of the encoding table.

9. The computing device of claim 8, wherein the text file is a localization resource file.

10. The computing device of claim 8, wherein the processor further compresses the text file by replacing a character set in a first text string with a second table index position of the encoding table.

11. The computing device of claim 8, wherein the processor sorts the encoding table by order of appearance in the text file or by number of appearances in the text file.

12. The computing device of claim 8, wherein the processor reorders the encoding table based on an American Standard Code for Information Interchange.

13. The computing device of claim 8, wherein the storage device stores a string character of the text file without encoding if the string character of the text file is not present in the dynamically generated encoding table.

14. The computing device of claim 8, wherein a size of the encoding table is based upon a language of the text file.

15. A tangible machine-readable medium having a set of instructions stored thereon for a method to be executed by at least one processor of a computing device, the method comprising:

receiving an encoded text file and an encoding table based upon the text file; and decompressing the encoded text file by replacing table index positions in the encoded text file with individual string characters from corresponding table index positions in the encoding table.

16. The set of instructions of claim 15, wherein the encoded text file is a localization resource file.

17. The set of instructions of claim 15, wherein the method further comprises:

decompressing the encoded text file by replacing one or more second table index positions in the encoded text file with a respective character set at a corresponding second table index position in the encoding table.

18. The set of instructions of claim 15, wherein the encoding table is sorted by order of appearance in the text file or number of appearances in the text file.

19. The set of instructions of claim 15, wherein the encoding table is ordered based on an American Standard Code for Information Interchange.

20. The set of instructions of claim 15, wherein the method further comprises:

copying a text string of the text file without decoding if the text string is marked unencoded.

* * * * *